(12) United States Patent
Sumitomo et al.

(10) Patent No.: US 10,388,773 B2
(45) Date of Patent: Aug. 20, 2019

(54) SEMICONDUCTOR DEVICE AND MANUFACTURING METHOD OF THE SAME

(71) Applicant: DENSO CORPORATION, Kariya, Aichi-pref. (JP)

(72) Inventors: Masakiyo Sumitomo, Kariya (JP); Shigeki Takahashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/310,244

(22) PCT Filed: Jul. 7, 2015

(86) PCT No.: PCT/JP2015/003420
§ 371 (c)(1),
(2) Date: Nov. 10, 2016

(87) PCT Pub. No.: WO2016/009616
PCT Pub. Date: Jan. 21, 2016

(65) Prior Publication Data
US 2017/0250269 A1    Aug. 31, 2017

(30) Foreign Application Priority Data

Jul. 14, 2014 (JP) ................................. 2014-144169
Jun. 15, 2015 (JP) ................................. 2015-120461

(51) Int. Cl.
*H01L 29/739* (2006.01)
*H01L 29/78* (2006.01)
(Continued)

(52) U.S. Cl.
CPC .......... *H01L 29/7397* (2013.01); *H01L 27/04* (2013.01); *H01L 27/0635* (2013.01);
(Continued)

(58) Field of Classification Search
CPC ................................................... H01L 29/7397
See application file for complete search history.

(56) References Cited

U.S. PATENT DOCUMENTS

| 6,566,691 | B1 * | 5/2003 | Inoue | H01L 29/66348 |
|---|---|---|---|---|
| | | | | 257/133 |
| 8,178,947 | B2 * | 5/2012 | Takahashi | H01L 29/7397 |
| | | | | 257/133 |
| 9,761,663 | B2 * | 9/2017 | Momota | H01L 29/0696 |
| 2009/0189181 | A1 * | 7/2009 | Koyama | H01L 29/0696 |
| | | | | 257/139 |

(Continued)

FOREIGN PATENT DOCUMENTS

| JP | 2002-170784 A | 6/2002 |
|---|---|---|
| JP | 2010-050211 A | 3/2010 |
| JP | 2013-026534 A | 2/2013 |

*Primary Examiner* — Benjamin P Sandvik
(74) *Attorney, Agent, or Firm* — Posz Law Group, PLC

(57) ABSTRACT

A semiconductor device includes: a drift layer; a base layer on the drift layer; a collector layer and a cathode layer opposite to the base layer; multiple trenches penetrating the base layer; a gate electrode in each trench; an emitter region in a surface portion of the base layer and contacting each trench; a first electrode connected to the base layer and the emitter region; and a second electrode connected to the collector layer and the cathode layer. The gate electrodes in a diode region of a semiconductor substrate are controlled independently from the gate electrodes in the IGBT region. A voltage not forming an inversion layer in the base layer is applied to the gate electrodes in the diode region.

6 Claims, 5 Drawing Sheets

(51) Int. Cl.
- *H01L 27/04* (2006.01)
- *H01L 27/06* (2006.01)
- *H01L 29/08* (2006.01)
- *H01L 29/10* (2006.01)
- *H01L 29/66* (2006.01)
- *H01L 29/40* (2006.01)
- *H01L 29/423* (2006.01)
- *H01L 29/861* (2006.01)
- *H01L 29/06* (2006.01)

(52) U.S. Cl.
CPC ...... *H01L 29/0804* (2013.01); *H01L 29/0821* (2013.01); *H01L 29/0834* (2013.01); *H01L 29/1095* (2013.01); *H01L 29/407* (2013.01); *H01L 29/4236* (2013.01); *H01L 29/66348* (2013.01); *H01L 29/78* (2013.01); *H01L 29/8613* (2013.01); *H01L 29/0696* (2013.01)

(56) References Cited

U.S. PATENT DOCUMENTS

| | | | |
|---|---|---|---|
| 2009/0278166 A1* | 11/2009 | Soeno | H01L 27/0664 257/133 |
| 2010/0090248 A1* | 4/2010 | Kouno | H01L 29/7395 257/140 |
| 2010/0156506 A1 | 6/2010 | Tsuzuki et al. | |
| 2010/0187567 A1 | 7/2010 | Tanabe et al. | |
| 2011/0073905 A1 | 3/2011 | Mori | |
| 2011/0220962 A1 | 9/2011 | Koyama et al. | |
| 2012/0025874 A1* | 2/2012 | Saikaku | H01L 29/1095 327/109 |
| 2012/0043581 A1* | 2/2012 | Koyama | H01L 29/0696 257/140 |
| 2012/0056242 A1 | 3/2012 | Tsuzuki et al. | |
| 2012/0313164 A1 | 12/2012 | Senoo | |
| 2013/0240947 A1 | 9/2013 | Matsudai et al. | |
| 2016/0035869 A1 | 2/2016 | Matsudai et al. | |

* cited by examiner

SEMICONDUCTOR DEVICE AND MANUFACTURING METHOD OF THE SAME

CROSS REFERENCE TO RELATED APPLICATIONS

This application is the U.S. national stage of International Patent Application No. PCT/JP2015/003420 filed on Jul. 7, 2015 and is based on Japanese Patent Applications No. 2014-144169 filed on Jul. 14, 2014, and No. 2015-120461 filed on Jun. 15, 2015, the disclosures of which are incorporated herein by reference.

TECHNICAL FIELD

The present disclosure relates to a semiconductor device having an IGBT (i.e., Insulated Gate Bipolar Transistor) region and a diode (Free Wheeling Diode) region.

BACKGROUND ART

Conventionally, for example, a semiconductor device is proposed as a switching device used for an inverter and the like such that an IGBT region and a diode region are commonly disposed on a semiconductor substrate, an IGBT element is formed in the TGBT region, and a diode element is formed in the diode region (See for example, Patent Literature No. 1).

Specifically, in the semiconductor device, a base layer is formed in a surface portion of the semiconductor substrate, which constitutes a drift layer having a N– conductive type, and multiple trenches are formed to penetrate the base layer. A gate insulation film is formed in each trench so as to cover a sidewall of the trench, and a gate electrode is formed on the gate insulation film.

On a backside of the semiconductor substrate, a cathode layer having a N conductive type and a collector layer having a P conductive type are formed. AN emitter region having the N conductive type is formed in a portion of the base layer disposed above the collector layer. Further, an upper electrode, which is electrically connected to the base layer and the emitter region, is formed on a surface side of the semiconductor substrate. On the backside of the semiconductor substrate, a lower electrode, which is electrically connected to the collector layer and the cathode layer, is formed. A region in which the collector layer is formed on the backside of the semiconductor substrate is defined as the IGBT region. A region in which the cathode layer is formed on the backside of the semiconductor substrate is defined as the diode region.

Here, the trench is formed in each of the IGBT region and the diode region. The gate electrode formed in the IGBT region and the gate electrode formed in the diode region are connected to a common gate pad so that a common voltage is applied to each other.

In the above semiconductor device, in the IGBT element, when a voltage lower than the lower electrode is applied to the upper electrode, and a turn-on voltage is applied to the gate electrode, an inversion layer (i.e., a channel) having the N conductive type is formed in a portion of the base layer contacting the trench. An electron is supplied to the drift layer via the inversion layer from the emitter region, and a hole is supplied from the collector layer to the drift layer. Thus, a resistance of the drift layer is reduced due to conductivity modulation, and it becomes to an on-state. Here, the turn-on voltage is a voltage for increasing the voltage Vge between the gate and the emitter to be higher than the threshold voltage Vth of the MOS gate.

In the diode element, a voltage higher than the lower electrode is applied to the upper electrode. When the voltage between the upper electrode and the lower electrode becomes higher than a forward voltage, it becomes to the on-state. At this time, the electron in the drift layer is discharged to the upper electrode via the base layer; and the hole is injected into the drift layer from the base layer when the electron passes through the base layer.

However, for example, in a case where an inverter circuit is formed using multiple semiconductor devices, the turn-on voltage may be applied to the gate electrode even when the diode element is in the on-state. When the diode element is in the on-state, and the turn-on voltage is applied to the gate electrode, the inversion layer having the N conductive type is formed in a portion of the base layer contacting the trench. In this case, in the diode region, the electron in the drift layer is discharged to the upper electrode via the inversion layer, and therefore, the electron does not pass through the base layer. Accordingly, the hole is not supplied to the drift layer from the base layer, and the conduction loss of the diode element becomes large.

Here, in order to solve the above difficulties, it is considered that no trench is formed in the diode region. However, when no trench is formed in the diode region, an electric field concentration occurs near the trench in the IGBT region formed on a diode region side. Thus, a new difficulty arises such that breakdown voltage is reduced.

PRIOR ART LITERATURES

Patent Literature

Patent Literature 1: JP-2013-197122 A

SUMMARY OF INVENTION

It is an object of the present disclosure to provide a semiconductor device such that a conduction loss of a diode element is reduced, and reduction of a breakdown voltage is restricted.

According to an aspect of the present disclosure, a semiconductor device includes: a semiconductor substrate including a drift layer having a first conductive type; a base layer having a second conductive type and disposed on the drift layer; a collector layer having the second conductive type and a cathode layer having the first conductive type which are disposed on the drift layer opposite to the base layer; a plurality of trenches penetrating the base layer and reaching the drift layer; a gate insulation film disposed on a sidewall of each trench; a gate electrode disposed on the gate insulation film; an emitter region disposed in a surface portion of the base layer, contacting each trench, and having the first conductive type; a first electrode electrically connected to the base layer and the emitter region; and a second electrode electrically connected to the collector layer and the cathode layer. The semiconductor substrate includes an IGBT region for functioning as an IGBT element and a diode region for functioning as a diode element. The plurality of trenches are disposed in each of the IGBT region and the diode region. At least a part of gate electrodes disposed in the diode region is controlled independently from at least a part of gate electrodes disposed in the IGBT region. A voltage not forming an inversion layer, which connects between the first electrode and the drift layer, in the base layer is applied to the at least the part of gate electrodes disposed in the diode region.

In the above semiconductor device, the voltage not forming the inversion layer, which connects between the first electrode and the drift layer, is applied to the at least the part of the gate electrodes disposed in the base layer of the diode region. Accordingly, when the first conductive type is the N conductive type, and the second conductive type is the P conductive type, the electron in the drift layer of the diode region flows into the first electrode via the base layer. Therefore, hole is injected unto the drift layer from the base layer. Thus, a conduction loss of the diode element is reduced. Further, since the trenches are arranged in each of the IGBT region and the diode region, an electric field concentration occurs near the trench arranged in the IGBT region on a diode region side, and therefore, the reduction of the breakdown voltage is restricted.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

First Embodiment

A first embodiment of the present disclosure will be explained. Here, the semiconductor device according to the present embodiment is suitably used for a power switching element, which is utilized in an electric power source circuit such as an inverter and a DC-DC converter.

Figure 1:
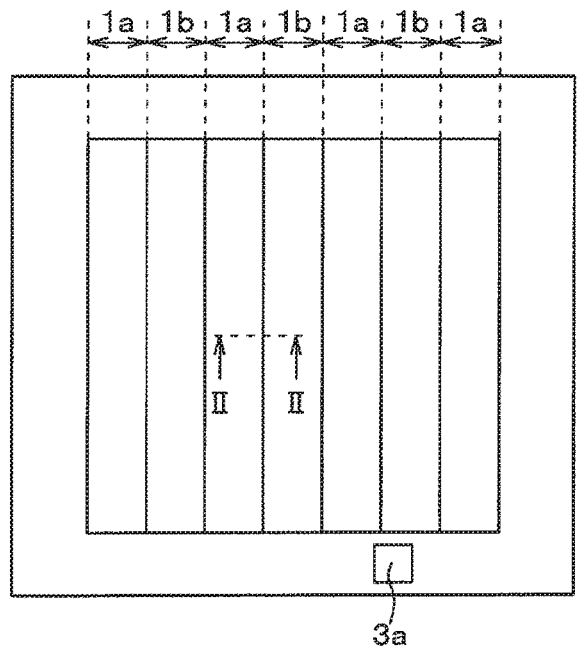
FIG. 1 is a diagram showing a plan view of a semiconductor device according to a first embodiment of the present disclosure.

As shown in FIG. 1, the semiconductor substrate has a structure such that the IGBT regions 1a, on which the IGBT element is formed, and the diode regions 1b, on which the diode element is formed, are alternately arranged.

Figure 2:
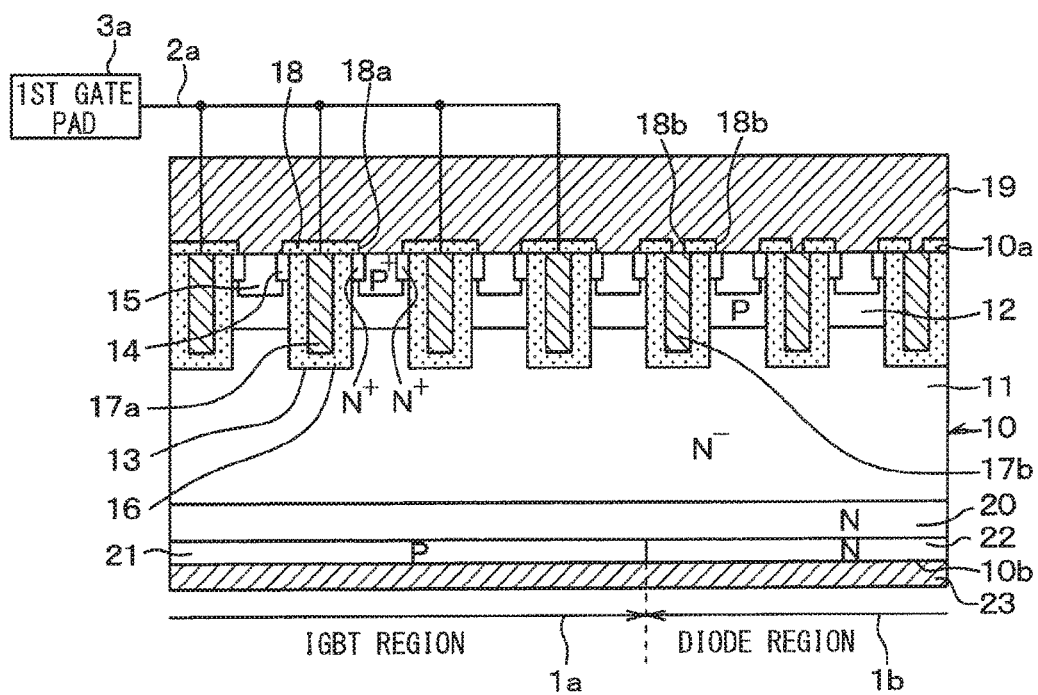
FIG. 2 is a diagram showing a cross sectional view along line II-II in 1.

Specifically, as shown in FIG. 2, these IGBT regions 1a and the diode regions 1b are formed in a common semiconductor substrate 10 having a N− conductive type for functioning as a drift layer 11. Here, the IGBT regions 1a and the diode regions 1b extend along one direction (i.e., a up-down direction of a sheet of a drawing in FIG. 1) on one surface 10a of the semiconductor substrate 10, and are formed alternately in a direction perpendicular to an extension direction.

A base layer 12 having the P conductive type is formed on the drift layer 11 (on the one surface side of the semiconductor substrate 10). Multiple trenches 13 are formed to penetrate the base layer 12 and reach the drift layer 11. The base layer 12 is divided into multiple parts by the trenches 13.

Here, multiple trenches 13 are formed in each of the IGBT region 1a and the diode region 1b. The trenches 13 are formed at equal intervals along one direction (i.e., a direction perpendicular to the sheet of the drawing in FIG. 2) on a planar direction of the one surface 10a of the semiconductor substrate 10. Further, the one surface 10a of the semiconductor substrate 10 is formed as a surface of the base layer 12 opposite to the drift layer 11.

The emitter region 14 having the N+ conductive type and the body region 15 having the P+ conductive type sandwiched by the emitter region 14 are formed in a surface portion of the base layer 12. Here, in the present embodiment, the emitter region 14 and the body region 15 are formed in each of the IGBT region 1a and the diode region 1b, respectively.

The emitter region 14 includes an impurity concentration higher than the drift layer 11. The emitter region 14 ends in the base layer 12, and contacts the sidewall of the trench 13. On the other hand, the body region 15 includes an impurity concentration higher than the base layer 12. The body region 15 ends in the base layer 12, similar to the emitter region 14.

Specifically, the emitter region 14 disposed between the trenches 13 extends with a rod shape along the longitudinal direction of the trench 13 so as to contact the sidewall of the trench 13. The emitter region 14 has a structure such that the emitter region 14 terminates in the base layer 12 inside from the end of the trench 13. Further, the body region 15 sandwiched between tow emitter regions 14 extends with a rod shape along the longitudinal direction of the trench 13 (i.e., the emitter region 14). Here, the body region 15 in the present embodiment is formed to be deeper than the emitter region 14 from the one surface 10a of the semiconductor substrate 10 as a reference surface.

The gate insulation film 16 which is formed to cover the sidewall of each trench 13 and the gate electrode 17a, 17b which is made of poly silicon or the like and formed on the gate insulation film 16 are embedded in each trench 13. Thus, the trench gate structure is formed.

In the present embodiment, the gate electrode 17a formed in the IGBT region 1a is defined as a first gate electrode 17a, and the gate electrode 17b formed in the diode region 1b is defined as a second gate electrode 17b.

The interlayer insulation film 18 made of BPSG or the like is formed on the base layer 12 (i.e., the one surface 10a of the semiconductor substrate 10). A contact hole 18a for exposing a part of the emitter region 14 and a part of the body region 15 is formed in the interlayer insulation film 18 of the IGBT region 1a. Further, a contact hole 18b for exposing a part of the emitter region 14 and a part of the body region 15 and a part of the second gate electrode 17b is formed in the interlayer insulation film 18 of the diode region 1b.

An upper electrode 19 is formed on the interlayer insulation film 18. The upper electrode 19 is electrically connected to the emitter region 14 and the body region 15 via the contact hole 18a, 18b in the IGBT region 1a and the diode region 1b, respectively. Specifically, the upper electrode 19 functions as the emitter electrode in the IGBT region 1a, and the upper electrode 19 functions as the anode electrode in the diode region 1b.

The upper electrode 19 is connected to the second gate electrode 17b via the contact hole 18b in the diode region 1b. Specifically, the second gate electrode 17b has a same electric potential as the emitter region 14. Thus, a voltage (i.e., Vge=0) as the voltage Vge between the gate and the emitter, which is not higher than the threshold voltage Vth of the MOS gate, is applied to the second gate electrode 17b. In other words, the voltage (i.e., the voltage not forming the inversion layer 24) lower than the voltage, at which the inversion layer 24 (see FIGS. 3A and 3B) connecting between the upper electrode 19 and the drift layer 11 is formed, is applied to the second gate electrode 17b.

Here, the inversion layer 24 connecting between the upper electrode 19 and the drift layer 11 means the inversion layer 24 for connecting between the emitter region 14 and the drift layer 11 in a case where the emitter region 14 is formed. Further, the first gate electrode 17a is connected to the first gate pad 3a via the first gate runner 2a. Thus, the first gate electrode 17a and the second gate electrode 17b are controlled independently so that different voltages are applied to the first and second gate electrodes 17a, 17b, respectively. In the present embodiment, the upper electrode 19 corresponds to the first electrode in the present disclosure.

The field stop layer (i.e., a FS layer) 20 having the N conductive type is formed in the drift layer 11 opposite to the base layer 12 (i.e., the other surface 10b side of the semiconductor substrate 10). It is not always necessary to use the FS layer 20. The FS layer 20 provides to improve the performance of the breakdown voltage and the stationary loss by restrict the expansion of the depletion layer, and provides to control the injection amount of the holes which is injected from the other surface 10b of the semiconductor substrate 10.

In the IGBT region 1a, the collector layer 21 having the P conductive type is formed to be opposite to the drift layer 11 with sandwiching the FS layer 20 therebetween. The cathode layer 22 having the N conductive type is formed in the diode region 1b to be opposite to the drift layer 11 with sandwiching the FS layer 20 therebetween. Thus, the IGBT region 1a and the diode region 1b are distinguished whether a layer to be formed on the other surface 10b side of the semiconductor substrate 10 is the collector layer 21 or the cathode layer 22. Accordingly, in the present embodiment, the semiconductor substrate 10 includes the IGBT region 1a disposed above the collector layer 21 and the diode region 1b disposed above the cathode layer 22. Thus, the first gate electrode 17a is the gate electrode 174a disposed above the collector layer 21, and the second gate electrode 17b is the gate electrode 17b disposed above the cathode layer 22.

The lower electrode 23 is formed above the collector layer 21 and the cathode layer 22 (on the other surface 10b of the semiconductor substrate 10). The lower electrode 23 functions as the collector electrode in the IGBT region 1a, and functions as the cathode electrode in the diode region 1b. Here, in the present embodiment, the lower electrode 23 corresponds to the second electrode in the present disclosure.

Since the device has the above structure, the base layer 12 and the body region 15 provide the anode in the diode region 1b, and the drift layer 11, the FS layer 20 and the cathode layer 22 in the diode region 1b provide the cathode, so that the diode element is formed.

As described above, the semiconductor device according to the present disclosure is formed. Here, in the present embodiment, the N conductive type, the N– conductive type and the N+ conductive type correspond to the first conductive type in the present disclosure, and the P conductive type and the P+ conductive type correspond to the second conductive type in the present disclosure. Next, the functions of the semiconductor device will be explained.

First, the functions of the IGBT element will be explained. In the IGBT element, when the voltage lower than the lower electrode 23 is applied to the upper electrode 19, and the turn-on voltage is applied to the first gate electrode 17a, the inversion layer (as a channel) having the N conductive type is formed in apportion of the base layer 12 contacting the trench 13. The electron is supplied from the emitter region 14 to the drift layer 11 via the inversion layer, and the hole is supplied from the collector layer 21 to the drift layer 11. Thus, the resistance of the drift layer 11 is reduced by modulation of the conductivity so that the device becomes to an on state. Here, the turn-on voltage is a voltage for increasing the voltage Vge between the gate and the emitter to be higher than the threshold voltage Vth of the gate.

Next, the functions of the diode element will be explained. In the diode element, when the voltage higher than the lower electrode 23 is applied to the upper electrode 19, and the voltage between the upper electrode 19 and the lower electrode 23 becomes higher than the forward voltage, the diode element turns on.

Figure 3A:
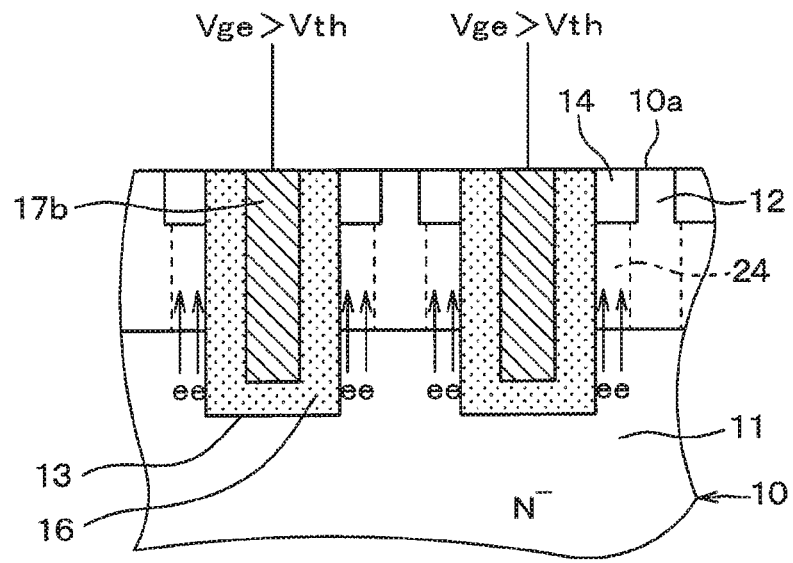
FIG. 3A is a diagram showing a state near a second gate electrode when a turn-on voltage is applied to the second gate electrode.

In the above case, in a conventional semiconductor device, as shown in FIG. 3A, the turn on voltage (Vge>Vth) is applied to the second gate electrode 17b, so that the inversion layer (as a channel) having the N conductive type is formed in a portion of the base layer 12 contacting the trench 13. Accordingly, in the diode region 1b, the electron in the drift layer 11 is discharged to the upper electrode 19 via the inversion layer, and the electron in the drift layer 11 does not flow through the base layer 12. Thus, the hole is not supplied from the base layer 12 to the drift layer 11, so that the conduction loss of the diode element becomes large.

Figure 3B:
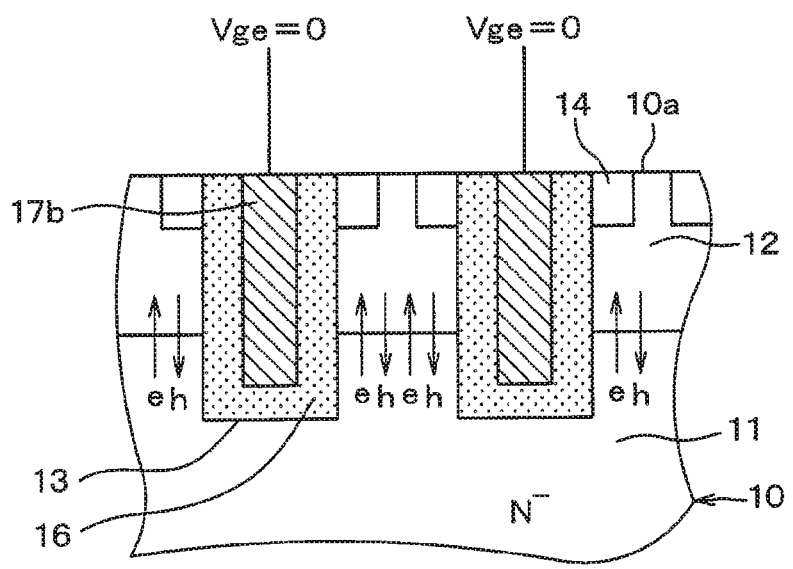
FIG. 3B is a diagram showing a state near the second gate electrode when a voltage lower than the turn-on voltage is applied to the second gate electrode.

On the other hand, in the present embodiment, as shown in FIG. 3B, the voltage different from the first gate electrode is applied to the second gate b electrode 17b, and therefore, the second gate electrode and the emitter region have the same electric potential. Specifically, the voltage Vge between the gate and the emitter is null. Accordingly, when the diode element turns on, the turn-on voltage is not applied to the second gate electrode which is disposed in the diode region 1b. Thus, the inversion layer 24 is not formed in the diode region 1b. Accordingly, the electron in the drift layer 11 is discharged to the upper electrode 19 via the base layer 12, and the hole is injected into the drift layer 11 from the base layer 12 when the electron passes through the base layer 12. Thus, the conduction loss of the diode element is reduced. Here, in FIGS. 3A and 3B, the body region 15 is not shown.

As described above, in the semiconductor device according to the present embodiment, the second gate electrode 17b has the same electric potential as the emitter region 14. Thus, the voltage not forming the inversion layer 24 connecting between the upper electrode 19 and the drift layer 11 is applied to the second gate electrode 17b. Accordingly, when the diode element is in the on state, the electron in the drift layer 11 flows into the upper electrode 19 via the base layer 12, so that the conduction loss of the diode element is reduced.

The trench 13 is formed in the IGBT region 1a and the diode region 1b, respectively. Accordingly, the electric field concentration occurs near the trench 13 which is formed in the IGBT region 1a on the diode region 1b side, and the reduction of the breakdown voltage is restricted.

Second Embodiment

A second embodiment of the present disclosure will be explained. In the present embodiment, the second gate electrode 17b is connected to the second gate pad, compared with the first embodiment. Other features in the second embodiment are similar to the first embodiment, and therefore, the other features will not be explained.

Figure 4:
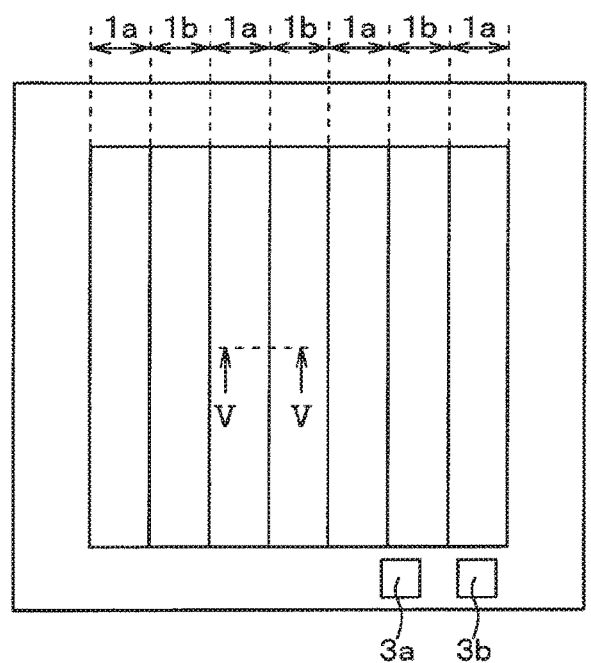
FIG. 4 is a diagram showing a plan view of a semiconductor device according to a second embodiment of the present disclosure.
Figure 5:
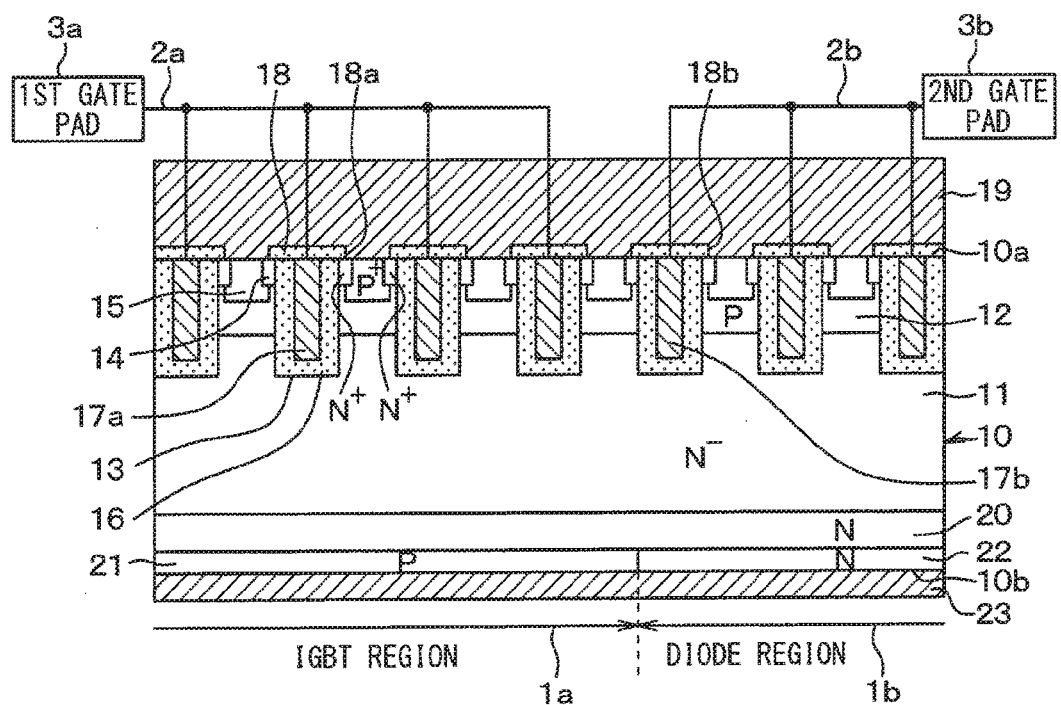
FIG. 5 is a diagram showing a cross sectional view along line V-V in FIG. 4.

In the present embodiment, as shown in FIGS. 4 and 5, the semiconductor device includes the second gate pad 3b. The second gate electrode 17b is electrically connected to the second gate pad 3b via the second gate runner 2b. In the present embodiment, thus, the first and second gate electrodes 17a, 17b are independently controller from each other.

Here, the voltage not forming the inversion layer 24 for connecting between the upper electrode 19 and the drift layer 11 is applied to the second gate electrode 17b when the semiconductor device functions. For example, the second gate pad 3b is connected to the ground electric potential of an external circuit so that the electric potential of the second gate electrode 17b is kept to be the ground electric potential (i.e., 0V).

Thus, the device includes the second gate pad 3b, and the first and second gate electrodes 17a, 17b are connected to different gate pads, respectively so that the first and second gate electrodes 17a, 17b are controlled independently. Even in this case, the effects of the first embodiment are obtained.

In the above semiconductor device the second gate electrode 17b does not have the same electric potential as the emitter region 14. Accordingly, after the semiconductor device is manufactured (before the semiconductor device is shipped), the voltage higher than a guaranteed voltage can be applied to the second gate electrode 17b. Thus, a screening test for determining whether the required breakdown voltage of the gate insulation film is obtained is performed by applying an electric potential stress to the gate insulation film 16 on which the second gate electrode 17b is arranged.

Third Embodiment

A third embodiment of the present disclosure will be explained. In the present embodiment, the dummy gate electrode is added in the IGBT region 1a, compared with the first embodiment. Other features are similar to the first embodiment, and therefore, the other features are not described.

Figure 6:
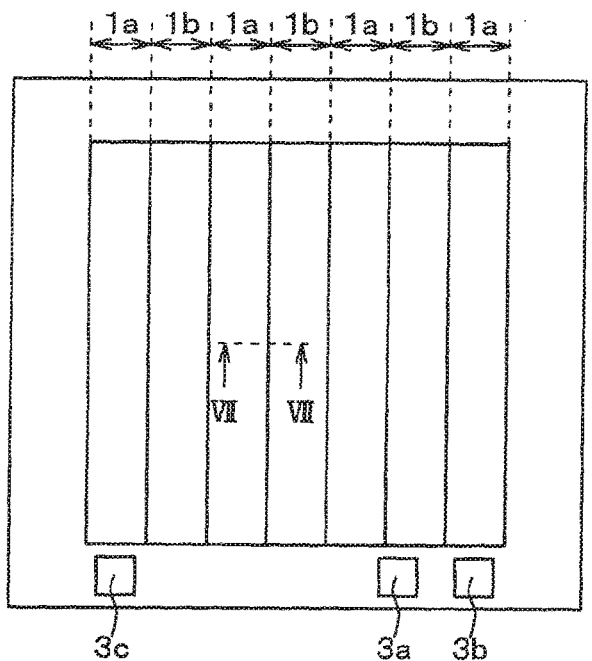
FIG. 6 is a diagram showing a plan view of a semiconductor device according to a third embodiment of the present disclosure.
Figure 7:
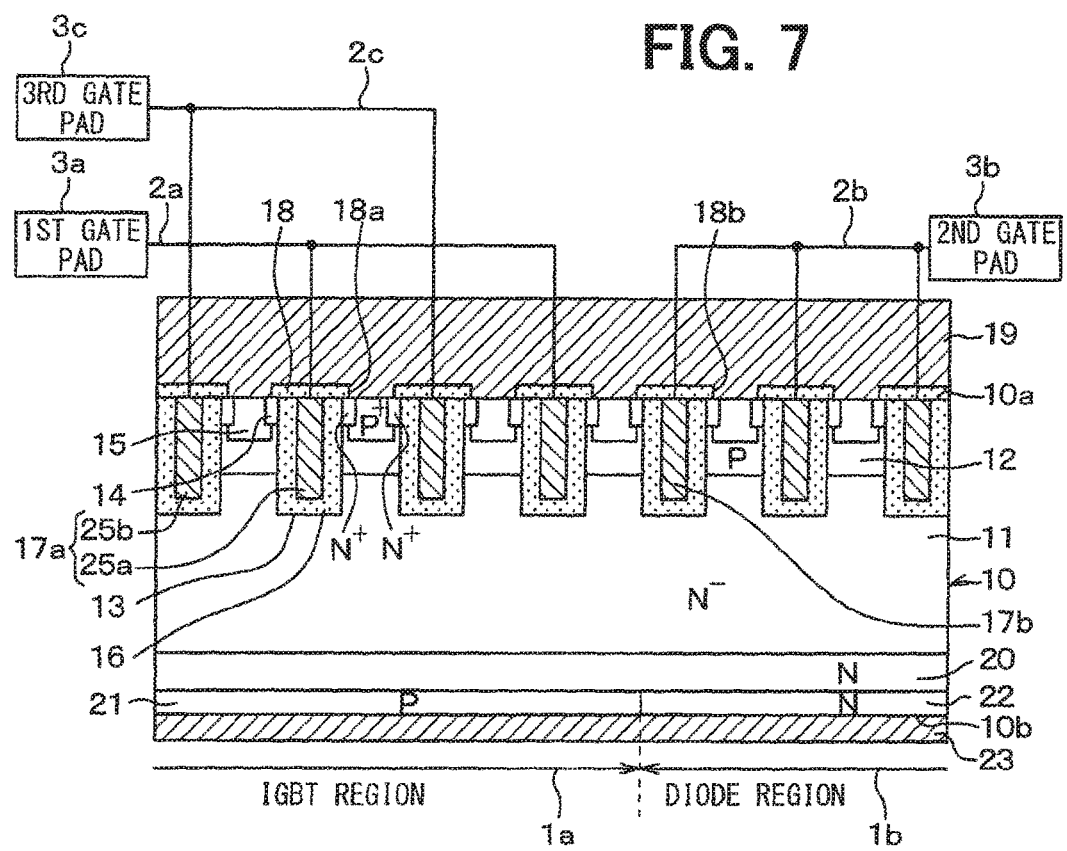
FIG. 7 is a diagram showing a cross sectional view along line VII-VII in FIG. 6.

In the present embodiment, as shown in FIGS. 6 and 7, the semiconductor device includes the third gate pad 3c. The first gate electrode 17a includes the element gate electrode 25a and a dummy gate electrode 25b. The element gate electrode 25a is electrically connected to the first gate pad 3a via the first gate runner 2a. The dummy gate electrode 25b is electrically connected to the third gate pad 3c via the third gate runner 2c. Thus, the element gate electrode 25a and the dummy gate electrode 25b in the first gate electrode 17a formed in the IGBT region 1a are controller independently. In the present embodiment, the element gate electrode 25a and the dummy gate electrode 25b are formed alternately in the direction perpendicular to the longitudinal direction of the trench 13, which is in parallel to the one surface 10a of the semiconductor substrate 10.

The voltage not forming the inversion layer 24 for connecting between the upper electrode 19 and the drift layer 11 is applied to the dummy gate electrode 25b when the device functions. In the present embodiment, the voltage not forming the inversion layer 24 itself is applied to a portion of the base layer 12 contacting the trench 13, in which the dummy gate electrode 25b is arranged. For example, the third gate pad 3c is connected to the ground electric potential of the external circuit so that the electric potential of the dummy gate electrode 25b is maintained to be the ground voltage (i.e., 0V). Thus, the semiconductor device according to the present embodiment is the thinning type semiconductor device.

In the above device, since the dummy gate electrode 25b is formed in the IGBT region 1a, the feedback capacity (or a capacitance between the gate and the collector) is reduced, and the switching speed is improved. Further, a part of the first gate electrode 17a is the dummy gate electrode 25b so that electric field concentration occurs and the reduction of the breakdown voltage is restricted, compared with a case where the number of the first gate electrodes 17a is simply decreased in order to reduce the feedback capacity.

Further, in the above semiconductor device, the dummy gate electrode 25b is connected to the third gate pad 3c, and the voltage can be applied to the dummy gate electrode 25b independently. Accordingly, similar to the second embodiment, after the semiconductor device is manufactured (before the semiconductor device is shipped), the voltage higher than a guaranteed voltage can be applied to the dummy gate electrode 25b. Thus, a screening test for the gate insulation film 16 on which the dummy gate electrode 25b is arranged is appropriately performed.

Modification of Third Embodiment

Figure 8:
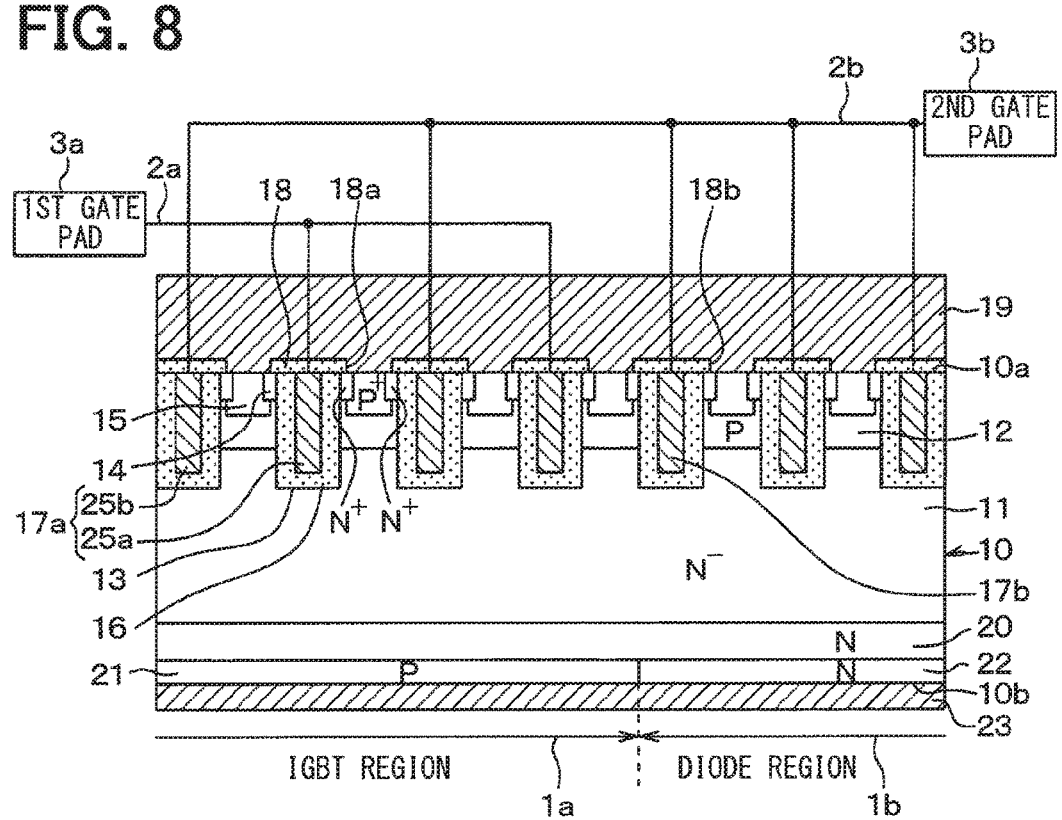
FIG. 8 is a diagram showing a cross sectional view of a semiconductor device according to a modification of the third embodiment of the present disclosure.

In the above third embodiment, an example is described such that the dummy gate electrode 25b is electrically connected to the third gate pad 3c. As shown in FIG. 8, the dummy gate electrode 25b may be electrically connected to the second gate pad 3b. Specifically, the dummy gate electrode 25b and the second gate electrode 17b may be connected to the same second gate pad 3b.

In the above case, the screening test can be performed for the gate insulation film 16, on which the dummy gate electrode 25b and the second gate electrode 17b are arranged, at the same time. Further, the number of gate pads and the number of gate runners or the like are reduced.

Other Embodiments

For example, in each of the above embodiments, the first conductive type is the P conductive type, and the second conductive type is the N conductive type. Alternatively, the first conductive type may be the N conductive type, and the second conductive type may be the P conductive type.

In each of the above embodiments, examples are described such that the voltage not forming the inversion layer 24 for connecting between the upper electrode 19 and the drift layer 11 is applied to all of the second gate electrodes 17b formed in the diode region 1b. Here, a boundary portion of the diode region 1b between the IGBT region 1a and the diode region 1b functions as the IGBT element. Accordingly, the voltage equal to the first gate electrode 17a may be applied to the second gate electrode 17b disposed at the boundary portion of the diode region 1b. Thus, the gate electrode disposed on the collector layer 21 side selected among the gate electrodes above the cathode layer 22 may function as the first gate electrode 17a. Specifically, when the voltage not forming the inversion layer 24 connecting between the upper electrode 19 and the drift layer 11 is applied to at least a part of the second gate electrodes 17b, the effects of the present disclosure are obtained.

Further, the boundary portion of the IGBT region 1a between the diode region 1b and the IGBT region 1a may function as the diode element. Accordingly, the voltage equal to the second gate electrode 17b may be applied to the first gate electrode 17a disposed in the IGBT region 1a on the boundary side. Specifically, the gate electrode on the cathode layer 22 side selected among the gate electrodes above the collector layer 21 may function as the second gate electrode 17b. In this case, the conduction loss of the diode element is much reduced.

Further, in each of the above embodiments, the voltage not forming the inversion layer 24 is applied to the second gate electrode 17b. Alternatively, the inversion layer 24 not connecting between the upper electrode (in the emitter region 14) and the drift layer 11 may be formed in the base layer 12. Specifically, in the second and third embodiments, the voltage forming the inversion layer 24, which does not connect between the emitter region 14 and the drift layer 11, may be applied to the second gate electrode 17b. Thus, even when the inversion layer 24 is formed, the electron in the drift layer 11 flows to the upper electrode 19 via the base layer 12 as long as the inversion layer 24 does not connect between the emitter region 14 and the drift layer 11. Thus, the conduction loss of the diode element is reduced.

In each of the above embodiments, the emitter region 14 and the body region 15 may not be formed in the diode region 1b. In this case, in the second and the third embodiments, the voltage for forming the inversion layer 24, which does not connect between the upper electrode 19 and the drift layer 11, may be applied to the second gate electrode 17b. Specifically, when the emitter region 14 is not formed in the diode region 1b, the inversion layer 24 may be formed in a portion, at which the emitter region 14 is formed in the second and the third embodiments, as long as the inversion layer 24 does not connect between the upper electrode 19 and the drift layer 11.

In the third embodiment, the emitter region 14 may not be formed in a portion of the base layer 12 which contacts the dummy gate electrode 25b.

Alternatively, the above embodiments may be combined. For example, the first embodiment may be combined with the second and the third embodiments, so that the dummy gate electrode 25b may be electrically connected to the emitter region 14. Alternatively, the emitter region 14 may be electrically connected to one of the dummy gate electrode 25b and the second gate electrode 17b.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
a semiconductor substrate including a drift layer having a first conductive type;
a base layer having a second conductive type and disposed on the drift layer;
a collector layer having the second conductive type and a cathode layer having the first conductive type which are disposed on the drift layer opposite to the base layer;
a plurality of trenches penetrating the base layer and reaching the drift layer;
a gate insulation film disposed on a sidewall of each trench;
a gate electrode disposed on the gate insulation film;
an emitter region disposed in a surface portion of the base layer, contacting each trench, and having the first conductive type;
a first electrode electrically connected to the base layer and the emitter region; and
a second electrode electrically connected to the collector layer and the cathode layer, wherein:
the semiconductor substrate includes an IGBT region for functioning as an IGBT element and a diode region for functioning as a diode element;
the plurality of trenches are disposed in each of the IGBT region and the diode region;
at least a part of gate electrodes disposed in the diode region is controlled independently from at least a part of gate electrodes disposed in the IGBT region;
a voltage not forming an inversion layer, which connects between the first electrode and the drift layer, in the base layer is applied to the at least the part of gate electrodes disposed in the diode region;
the at least the part of gate electrodes in the diode region has an electric potential equal to the emitter region in the diode region;
the gate electrode in the diode region is connected to the emitter region in the diode region via the first electrode;
the gate electrode in the IGBT region is insulated from the first electrode by an interlayer insulation film;
the gate electrode in the diode region is connected to the first electrode via a contact hole disposed in the interlayer insulation film;
each gate electrode disposed in the IGBT region includes an element gate electrode and a dummy gate electrode;
the element gate electrode and the dummy gate electrode are controlled independently from each other;
a voltage for functioning the IGBT element is applied to the element gate electrode; and
the voltage not forming the inversion layer, which connects between the first electrode and the drift layer, in the base layer is applied to the dummy gate electrode; and
the at least the part of gate electrodes disposed in the diode region and the dummy gate electrode are connected to a common gate pad different from the other gate pad which is connected to the element gate electrode.

2. The semiconductor device according to claim 1, wherein:
the at least the part of gate electrodes disposed in the diode region is electrically connected to the first electrode; and
the at least the part of gate electrodes disposed in the diode region has an electric potential equal to the emitter region.

3. The semiconductor device according to claim 1, wherein:
the first electrode in the diode region is electrically connected to the gate electrode in the diode region via the contact hole.

4. The semiconductor device according to claim 1, wherein:

the element gate electrode and the dummy gate electrode are arranged alternately in a direction perpendicular to a longitudinal direction of the trenches, which is in parallel to a surface of the semiconductor substrate.

5. The semiconductor device according to claim 1, further comprising:
a body region disposed in another surface portion of the base layer, wherein:
the emitter region is disposed on both sidewalls of each trench; and
the body region is sandwiched between the emitter region on a sidewall of one trench and the emitter region on another sidewall of an adjacent trench.

6. The semiconductor device according to claim 1, wherein:
the body region does not contact each trench.

* * * * *